United States Patent
Yoon (10) Patent No.: US 12,301,155 B2
(45) Date of Patent: May 13, 2025

(54) MOTOR DRIVER, MOTOR DRIVE SYSTEM, AND METHOD OF DRIVING MOTOR

(71) Applicant: LX SEMICON CO., LTD., Daejeon (KR)

(72) Inventor: Jang Hyun Yoon, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 18/240,691

(22) Filed: Aug. 31, 2023

(65) Prior Publication Data

US 2024/0072693 A1    Feb. 29, 2024

(30) Foreign Application Priority Data

Aug. 31, 2022    (KR) .................. 10-2022-0109849

(51) Int. Cl.
| | | |
|---|---|---|
| *H02M 3/158* | (2006.01) | |
| *G01R 19/175* | (2006.01) | |
| *H02K 11/33* | (2016.01) | |
| *H02P 6/182* | (2016.01) | |

(52) U.S. Cl.
CPC ............ *H02P 6/182* (2013.01); *G01R 19/175* (2013.01); *H02K 11/33* (2016.01)

(58) Field of Classification Search
CPC .......... H02P 6/182; H02P 6/185; H02P 6/085; H02P 6/18; H02P 25/03; H02P 27/08; H02P 2203/07; H02K 11/33; H02M 1/088; H02M 7/5387
See application file for complete search history.

(56) References Cited

U.S. PATENT DOCUMENTS

| | | | |
|---|---|---|---|
| 2005/0077854 A1* | 4/2005 | Lelkes | ................. H02P 6/15 318/400.29 |
| 2007/0194734 A1* | 8/2007 | Weinmann | ....... H03K 17/08142 318/400.31 |
| 2007/0252542 A1 | 11/2007 | Gauthier et al. | |
| 2009/0096397 A1 | 4/2009 | Paintz et al. | |
| 2012/0293098 A1 | 11/2012 | Rote et al. | |
| 2014/0340783 A1 | 11/2014 | Miura | |
| 2019/0379288 A1* | 12/2019 | Chaput | ................. H02M 1/083 |

FOREIGN PATENT DOCUMENTS

EP    2302785 A2    3/2011

OTHER PUBLICATIONS

Extended European Search Report issued for the corresponding European patent application 23194176.6, on Jan. 22, 2024, 9 pages.

* cited by examiner

*Primary Examiner* — Muhammad S Islam
(74) *Attorney, Agent, or Firm* — ROTHWELL, FIGG, ERNST & MANBECK, P.C.

(57) ABSTRACT

The present disclosure relates to a motor driver capable of precisely detecting a zero-crossing point of a phase current by sensing the phase current, and the motor driver according to one embodiment may include a current sensor connected to a switching circuit for driving a specific coil among three-phase coils and configured to sense a phase current flowing through the specific coil and a zero detector for detecting a time point when a first peak value is generated and a time point when a second peak value is generated from an output of the current sensor and detect a zero-crossing point of the phase current using the time points when the first and second peak values are generated.

20 Claims, 7 Drawing Sheets

MOTOR DRIVER, MOTOR DRIVE SYSTEM, AND METHOD OF DRIVING MOTOR

CROSS-REFERENCE TO RELATED APPLICATIONS

This application claims the benefit of the Korean Patent Application No. 10-2022-0109849 filed on Aug. 31, 2022, which is hereby incorporated by reference as if fully set forth herein.

BACKGROUND

Field of the Invention

The present disclosure relates to a motor driver, a motor drive system, and a method of driving a motor, which may precisely detect a zero-crossing point of a phase current.

Discussion of the Related Art

Recently, various electronic devices including vehicles or home appliances, such as washing machines and refrigerators, use a brushless direct current (hereinafter, referred to as a "BLDC") motor with high energy efficiency because the BLDC motor does not use a brush for commutation.

The BLDC motors may perform electronic commutation for changing a direction of a current flowing through coils of an armature and form a continuous rotational magnetic field which rotates the rotor when a position of the rotor and a time point of commutation match.

BLDC motor drivers may control the driving of the motor using a phase current flowing through a coil when the motor is driven and a back-electromotive force (BEMF) induced in the coil. For example, the BLDC motor drivers can increase motor efficiency by controlling a drive signal to match a phase of the phase current and a phase of a BEMF voltage when the motor is driven.

The BLDC motor driver needs to precisely detect the zero-crossing point of the phase current because BEMF voltage and current phases are detected using the zero-crossing point of the phase current.

SUMMARY

The present disclosure is directed to providing a motor driver, a motor drive system, and a method of driving a motor, which may precisely detect a zero-crossing point of a phase current by sensing the phase current.

In addition, the present disclosure is directed to providing a motor driver, a motor drive system, and a method of driving a motor, which may increase motor efficiency or a drive speed of the motor by performing lead angle control using a zero-crossing point of a phase current and a back-electromotive force voltage.

A motor driver according to one embodiment of the present disclosure may include a current sensor connected to a switching circuit for driving a specific coil among three-phase coils and for sensing a phase current flowing through the specific coil and a zero detector for detecting a time point when a first peak value is generated and a time point when a second peak value is generated from an output of the current sensor and detect a zero-crossing point of the phase current using the time points when the first and second peak values are generated.

A motor driver according to one embodiment of the present disclosure may include a current detector for detecting a zero-crossing point of a phase current using a time point when a first peak value is generated and a time point when a second peak value is generated from a result of sensing the phase current flowing through a specific coil among three-phase coils through an inverter configured to drive the three-phase coils, a BEMF voltage detector for detecting a BEMF voltage of the specific coil in a floating period of the specific coil set based on the zero-crossing point, a pulse controller including at least one of a speed controller for compensating for a voltage error between a reference voltage and the BEMF voltage and a phase controller for compensating for a phase error between a reference phase and a phase of the phase current at the zero-crossing point, a pulse width modulation (PWM) generator for generating a PWM signal using an output of the pulse controller, and a gate driver for generating a plurality of gate signals for controlling the inverter using the PWM signal and output the plurality of gate signals to the inverter.

A motor drive system according to one embodiment of the present disclosure may include a motor including three-phase coils, an inverter for driving the three-phase coils in response to a PWM gate signal, a motor driver for generating the PWM gate signal, and a controller for supplying a target PWM duty cycle corresponding to a target speed to the motor driver. The motor driver may detect a zero-crossing point of a phase current using a time point when a first peak value is generated and a time point when a second peak value is generated from a result of sensing the phase current flowing through a specific coil among the three-phase coils through the inverter, detect a BEMF voltage of the specific coil in a floating period of the specific coil set based on the zero-crossing point, perform speed control for determining a speed control value for compensating for a voltage error between a reference voltage and the BEMF voltage and phase control for determining a phase control value for compensating for a phase error between a reference phase and a phase of the phase current at the zero-crossing point, generate a PWM signal by applying the target PWM duty cycle, the speed control value, and the phase control value, and generate the PWM gate signal using the PWM signal to output the PWM gate signal to the inverter.

A method of driving a motor according to one embodiment of the present disclosure may include sensing a phase current flowing through a specific coil among three-phase coils through an inverter configured to drive the three-phase coils of a motor which normally operates and detecting a zero-crossing point of the phase current using a peak value of the phase current, setting a floating period in a next period using the detected zero-crossing point and floating the specific coil in the set floating period, detecting a BEMF voltage of the specific coil by sensing a voltage of the floated specific coil through the inverter at the zero-crossing point of the phase current, performing speed control for determining a speed control value for compensating for a voltage error between a reference voltage and the BEMF voltage and phase control for determining a phase control value for compensating for a phase error between a reference phase and a phase of the zero-crossing point of the phase current, generating a PWM signal by applying a target PWM duty cycle, the speed control value, and the phase control value, and generating a PWM gate signal for controlling the inverter using the PWM signal and outputting the PWM gate signal to the inverter.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION OF THE DISCLOSURE

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part can be added unless 'only' is used. The terms of a singular form can include plural forms unless referred to the contrary.

In construing an element, the element is construed as including an error range although there is no explicit description.

In describing a position relationship, for example, when a position relation between two parts is described as "on," "over," "under," and "next," one or more other parts can be disposed between the two parts unless a more limiting term, such as "just" or "direct(ly)" is used.

In describing a time relationship, for example, when the temporal order is described as, for example, "after," "subsequent," "next," and "before," a case which is not continuous can be included unless a more limiting term, such as "just," "immediate(ly)," or "direct(ly)" is used.

It will be understood that, although the terms "first," "second," etc. can be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, the terms "first," "second," "A," "B," "(a)," "(b)," etc., can be used. These terms are intended to identify the corresponding elements from the other elements, and basis, order, or number of the corresponding elements should not be limited by these terms. The expression that an element or a layer is "connected," "coupled," or "adhered" to another element or layer, the element or layer can not only be directly connected or adhered to another element or layer, but also be indirectly connected or adhered to another element or layer with one or more intervening elements or layers "disposed" between the elements or layers, unless otherwise specified.

The term "at least one" should be understood as including any and all combinations of one or more among the associated listed elements. For example, the meaning of "at least one or more of a first element, a second element, and a third element" denotes the combination of all elements proposed from two or more of the first element, the second element, and the third element as well as the first element, the second element, or the third element.

Features of various aspects of the present disclosure can be partially or overall coupled to or combined with each other, and can be variously inter-operated with each other and driven technically as those skilled in the art can sufficiently understand. The aspects of the present disclosure can be carried out independently from each other, or can be carried out together in co-dependent relationship.

Hereinafter, embodiments of the specification will be described in detail with reference to the accompanying drawings.

Figure 1:
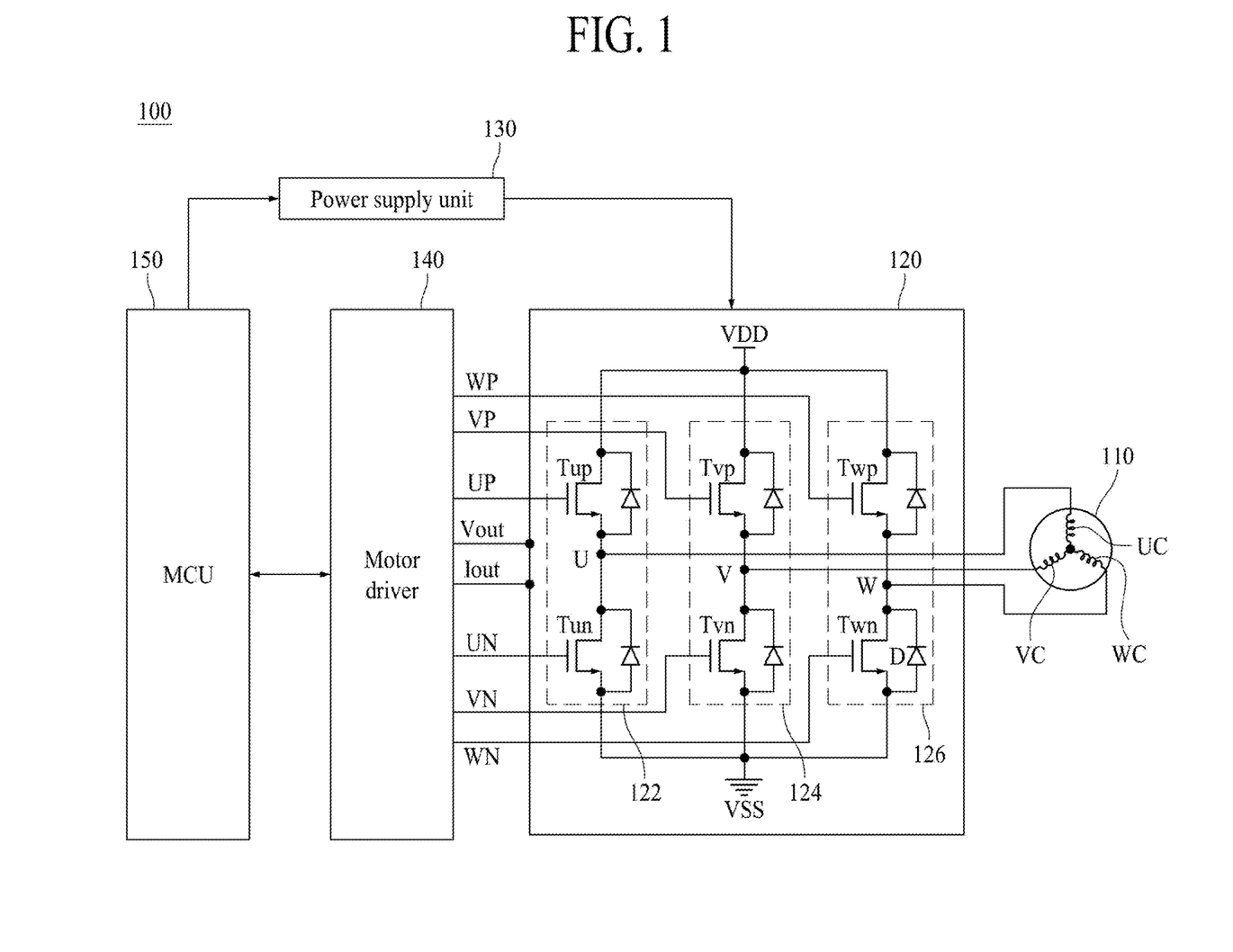
FIG. 1 is a block diagram showing a configuration of a brushless direct current (BLDC) motor drive system according to one embodiment.

FIG. 1 is a block diagram showing a configuration of a brushless direct current (BLDC) motor drive system according to one embodiment.

Referring to FIG. 1, a BLDC motor drive system 100 according to one embodiment may include a BLDC motor 110, an inverter 120, a power supply unit 130, a motor driver 140, and a microcontroller unit (MCU) 150. The inverter 120, the power supply unit 130, the motor driver 140, and the MCU 150 may be integrated into an integrated circuit (IC).

The BLDC motor 110 may include a stator including three-phase coils UC, VC, and WC having different phases and a rotor using a permanent magnet, and the rotor is omitted in FIG. 1. The BLDC motor 110 may be a sensorless BLDC motor not including a Hall sensor.

The stator of the BLDC motor 110 may include a first coil UC having a U-phase (first phase), a second coil VC having a V-phase (second phase), and a third coil WC having a W-phase (third phase).

The BLDC motor 110 may be driven according to a drive signal supplied from the inverter 120 to each of the three-phase coils UC, VC, and WC. The BLDC motor 110 may generate a magnetic force when a current flows in a desired coil among the first to third coils UC, VC, and WC of the stator according to a position of the rotor, and the generated magnetic force may rotate the rotor of the BLDC motor 110. For example, in the BLDC motor 110, a current flows in the first coil UC in a positive (+) direction, no current flows in the second coil VC, and a current flows in the third coil WC in a negative (−) direction according to the drive signals. In this case, in the BLDC motor 110, the first coil UC becomes an N pole and pulls an S pole of the rotor formed of a permanent magnet, and the third coil WC becomes an S pole and pushes the S pole of the rotor, and thus the rotor may be rotated.

The inverter 120 may operate under the control of the motor driver 140 to supply a first power supply voltage VDD or supply a second power supply voltage VSS to each of the three-phase coils UC, VC, and WC of the BLDC motor 110 through each of first to third nodes U, V, and W. The first power supply voltage VDD may be a high potential power supply voltage, and the second power supply voltage VSS may be a low potential power supply voltage.

The inverter 120 may float a specific coil without supplying the first and second power supply voltages VDD and VSS to any one of the three-phase coils UC, VC, and WC under the control of the motor driver 140.

The inverter 120 may receive the first power supply voltage VDD and the second power supply voltage VSS from the power supply unit 130. The inverter 120 may receive 1-1 and 1-2 gate signals UP and UN, 2-1 and 2-2 gate signals VP and VN, and 3-1 and 3-2 gate signals WP and WN from the motor driver 140. The gate signals UP, UN, VP, VN, WP, and WN supplied from the motor driver 140 may be pulse width modulation (PWM) gate signals.

The inverter 120 may include a first driver 122 for driving the first coil UC of the BLDC motor 110, and the first driver 122 may include a first pull-up transistor Tup and a first pull-down transistor Tun connected in series between a supply line of the first power supply voltage VDD and a supply line of the second power supply voltage VSS. The first driver 122 may apply a first drive signal to the first coil UC through a first node U between the first pull-up transistor Tup and the first pull-down transistor Tun.

The first pull-up transistor Tup may be turned on for a period in which the 1-1 gate signal UP is a gate-on voltage and may apply the first power supply voltage VDD to the first coil UC through the first node U. The first pull-down transistor Tun may be turned on for a period in which the 1-2 gate signal UN is the gate-on voltage and may apply the second power supply voltage VSS through the first node U to the first coil UC.

Meanwhile, when both of the 1-1 and 1-2 gate signals UP and UN supplied from the motor driver 140 are gate-off voltages, both of the first pull-up transistor Tup and the first pull-down transistor Tun may be turned off, and thus the first node U and the first coil UC may be in floating states.

The inverter 120 may include a second driver 124 for driving the second coil VC of the BLDC motor 110, and the second driver 124 may include a second pull-up transistor Tvp and a second pull-down transistor Tvn connected in series between the supply line of the first power supply voltage VDD and the supply line of the second power supply voltage VSS. The second driver 124 may apply a second drive signal to the second coil VC through a second node V between the second pull-up transistor Tvp and the second pull-down transistor Tvn.

The second pull-up transistor Tvp may be turned on for a period in which the 2-1 gate signal VP is the gate-on voltage and may apply the first power supply voltage VDD to the second coil VC through the second node V. The second pull-down transistor Tvn may be turned on for a period in which the 2-2 gate signal VN is the gate-on voltage and may apply the second power supply voltage VSS to the second coil VC through the second node V.

Meanwhile, when both of the 2-1 and 2-2 gate signals VP and VN supplied from the motor driver 140 are the gate-off voltages, both of the second pull-up transistor Tvp and the second pull-down transistor Tvn may be turned off, and thus the second node V and the second coil VC may be in the floating states.

The inverter 120 may include a third driver 126 for driving the third coil WC of the BLDC motor 110, and the third driver 126 may include a third pull-up transistor Twp and a third pull-down transistor Twn connected in series between the supply line of the first power supply voltage VDD and the supply line of the second power supply voltage VSS. The third driver 126 may apply the third drive signal to the third coil WC through a third node W between the third pull-up transistor Twp and the third pull-down transistor Twn.

The third pull-up transistor Twp may be turned on for a period in which the 3-1 gate signal WP is the gate-on voltage and may apply the first power supply voltage VDD to the third coil WC through the third node W. The third pull-down transistor Twn may be turned on for a period in which the 3-2 gate signal WN is the gate-on voltage and may apply the second power supply voltage VSS to the third coil WC through the third node W.

Meanwhile, when both of the 3-1 and 3-2 gate signals WP and WN supplied from the motor driver 140 are the gate-off voltages, both of the third pull-up transistor Twp and the third pull-down transistor Twn may be turned off, and thus the third node W and the third coil WC may be in the floating states.

Each of the first to third drivers 122, 124, and 126 of the inverter 120 may be referred to as a half bridge circuit or a switching circuit. Each of the pull-up transistors Tup, Tvp, and Twp may be referred to as a high-side switching element. Each of the pull-down transistors Tun, Tvn, and Twn may be referred to as a low-side switching element. Each of the pull-up transistors Tup, Tvp, and Twp and each of the pull-down transistors Tun, Tvn, and Twn may include a body diode D.

Each of the PWM gate signals UP, UN, VP, VN, WP, and WN applied from the motor driver 140 to the inverter 120 may have a form in which a PWM duty cycle gradually varies according to a modulation waveform. Therefore, the inverter 120 may output a drive signal in the form of a sine wave to each of the three-phase coils UC, VC, and WC. In each of the three-phase coils UC, VC, and WC, a sine wave-shaped phase voltage, phase current, and back electromotive force voltage (BEMF) may be generated.

The motor driver 140 may control a speed of the motor driver 140 by adjusting the PWM duty cycles of the gate signals UP, UN, VP, VN, WP, and WN. The motor driver 140 may receive a target PWM duty cycle from the MCU 150 and generate a PWM signal whose duty cycle is changed according to the target PWM duty cycle. The motor driver 140 may generate the gate signals UP, UN, VP, VN, WP, and WN using PWM signals according to a drive sequence of the three-phase coils UC, VC, and WC and output the gate signals to the inverter 120.

The MCU 150 may control a drive speed of the BLDC motor 110 by adjusting the PWM duty cycle of the motor driver 140 or adjusting a drive voltage VDD of the power supply unit 130. The MCU 150 may be referred to as a controller.

The MCU 150 may determine a target speed for the BLDC motor 110 and provide the target PWM duty cycle corresponding to the determined target speed to the motor driver 140.

In order to increase efficiency or the drive speed of the BLDC motor 110, the motor driver 140 may control a PWM duty cycle by repeatedly performing lead angle control every drive period in a closed loop control method when driving the BLDC motor 110 through the inverter 120.

The motor driver 140 may detect a zero-crossing point of a phase current and the BEMF voltage by sensing drive signals Vout and Tout of any one specific coil of the three-phase coils UC, VC, and WC from the inverter 120.

The motor driver 140 may detect a time point when each of peak values is generated by sensing and summing the phase current Tout flowing through at least one specific coil through the inverter 120 and detect a median time point between time points when the peak values are generated as a zero-crossing point of the phase current. A detailed description thereof will be made below with reference to FIGS. 3 and 4.

The motor driver 140 may set a floating period of the specific coil based on the detected zero-crossing point. The motor driver 140 may simply detect the BEMF voltage by sensing the phase voltage Vout of a floated coil through the inverter 120 in the set floating period.

The motor driver 140 may perform the lead angle control including at least one of speed control for compensating for an error between a reference voltage and the BEMF voltage and phase control for compensating for a phase error between a reference phase and the phase of the phase current using the detected BEMF voltage and zero-crossing point of the phase current. A detailed description thereof will be made below with reference to FIGS. 5 to 7.

The motor driver 140 can increase the motor drive efficiency by controlling the PWM signal to synchronize the phase of the phase current with a phase of the BEMF voltage by performing the lead angle control. The motor driver 140 may quickly increase a motor drive speed to a target speed by controlling the PWM signal so that the phase of the phase current is earlier than the phase of the BEMF voltage by performing the lead angle control.

Figure 2:
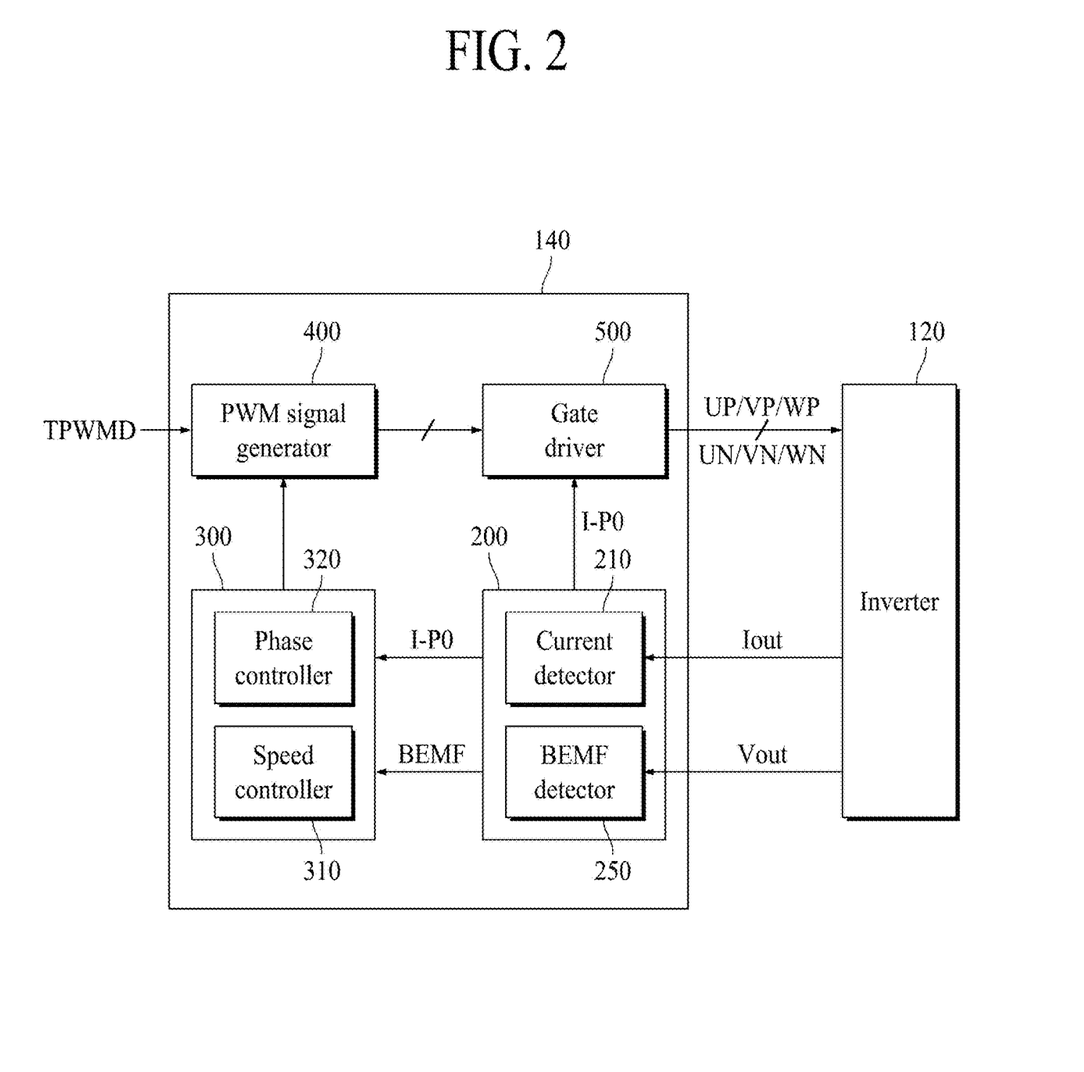
FIG. 2 is a block diagram showing a configuration of a motor driver according to one embodiment.

FIG. 2 is a block diagram showing a configuration of a motor driver according to one embodiment.

Referring to FIG. 2, the motor driver 140 may include a detector 200, a pulse controller 300, a PWM generator 400, and a gate driver 500.

The detector 200 may detect a zero-crossing point (I-P0) of the phase current and the BEMF voltage by sensing the drive signals Vout and Iout for any one specific coil of the three-phase coils UC, VC, and WC through the inverter 120. To this end, the detector 200 may include a current detector 210 and a BEMF voltage detector 250.

The current detector 210 may sense the phase current Iout flowing through the specific coil through the inverter 120 for driving the BLDC motor 110 and detect and output the zero-crossing point (I-P0) at which the phase current Iout becomes zero.

For example, the current detector 210 may detect the peak values and detect the time point when each peak value is generated by sensing currents of each of the pull-up transistor and the pull-down transistor for driving the specific coil in the inverter 120, summing the currents, and then digitizing the summed current. The current detector 210 may detect and output the median time point between the time points when the peak values are generated as the zero-crossing point (I-P0) of the phase current. A detailed description thereof will be made below with reference to FIGS. 3 and 4.

The gate driver 500 may receive the zero-crossing point (I-P0) of the phase current from the current detector 210 and set a floating period of a specific coil UC in a next cycle based on the zero-crossing point (I-P0). The gate driver 500 may float the specific coil UC by supplying gate signals UP and UN of a gate-off voltage to the driver 122 of the specific coil UC in the set floating period.

The BEMF voltage detector 250 may detect a BEMF voltage of the specific coil UC by sensing the phase voltage Vout of the floated specific coil UC through the inverter 120 at the zero-crossing point (I-P0) of the phase current received from the current detector 210 and then digitizing the phase voltage Vout.

The pulse controller 300 may control the PWM signal by performing the lead angle control including at least one of the speed control for compensating for the error between the reference voltage and the BEMF voltage and the phase control for compensating for the phase error between the reference phase and the phase of the phase current. To this end, the pulse controller 300 may include a speed controller 310 and a phase controller 320.

The speed controller 310 may calculate a voltage error value between the reference voltage and the BEMF voltage received from the BEMF voltage detector 250 and control the PWM speed (frequency) to compensate for the calculated voltage error value. A detailed description thereof will be made below with reference to FIGS. 5 to 7.

The phase controller 320 may calculate a phase error value between the reference phase and the phase of the zero-crossing point (I-P0) of the phase current received from the current detector 210 and control the PWM phase to compensate for the calculated phase error value. A detailed description thereof will be made below with reference to FIGS. 5 to 7.

The PWM generator 400 may generate a PWM signal based on a target PWM duty cycle TPWMD received from the MCU 150 and a speed control value and a phase control value received from the pulse controller 300. The PWM generator 400 may adjust the PWM duty cycle by applying the target PWM duty cycle TPWMD, the speed control value, and the phase control value and generate and output a PWM signal having the adjusted duty cycle.

The gate driver 500 may generate the gate signals UP, UN, VP, VN, WP, and WN using the PWM signal according to the drive sequence of the three-phase coils UC, VC, and WC and output the gate signals to the inverter 120.

Figure 3:
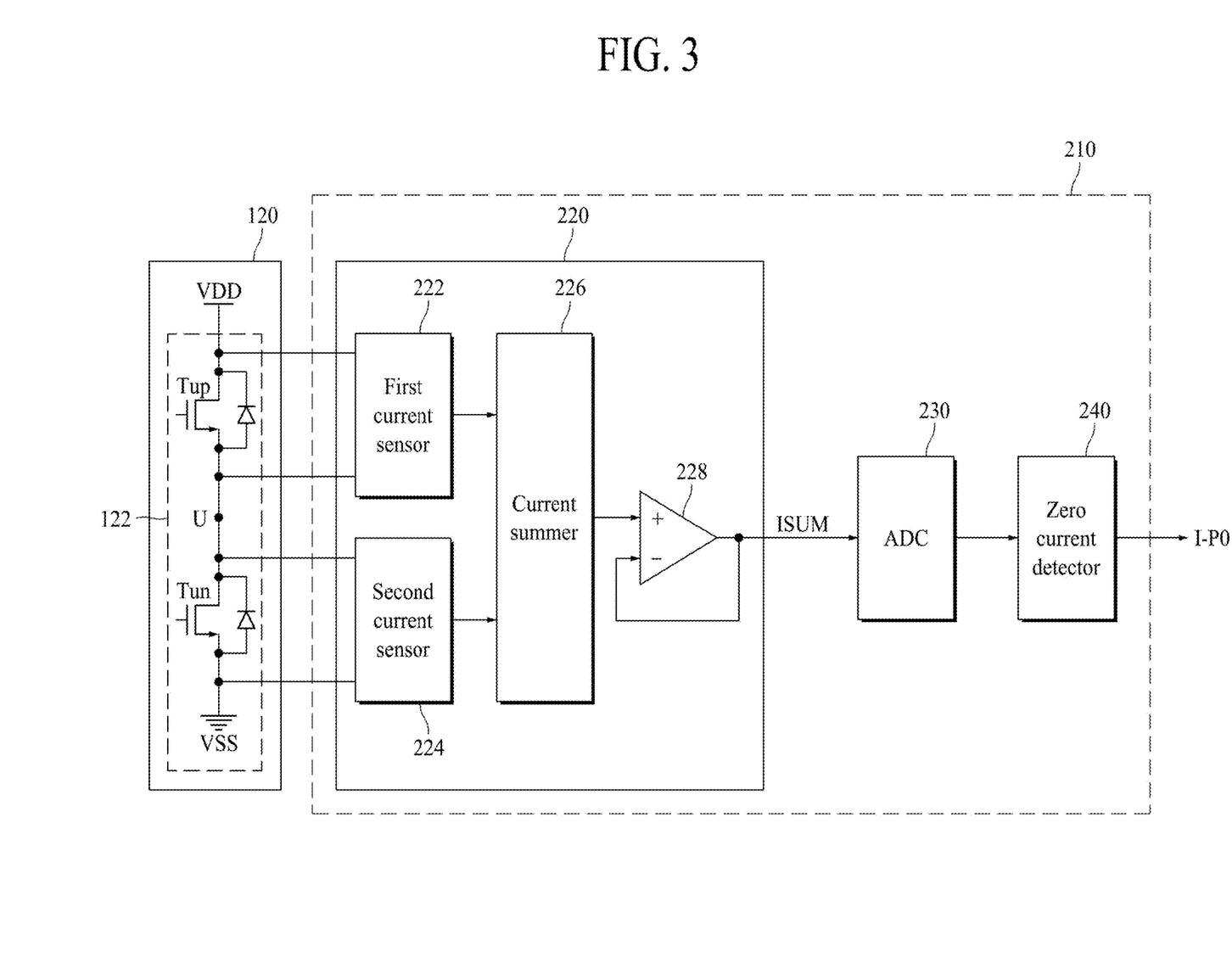
FIG. 3 is a block diagram showing a configuration of a current detector according to one embodiment.
Figure 4:
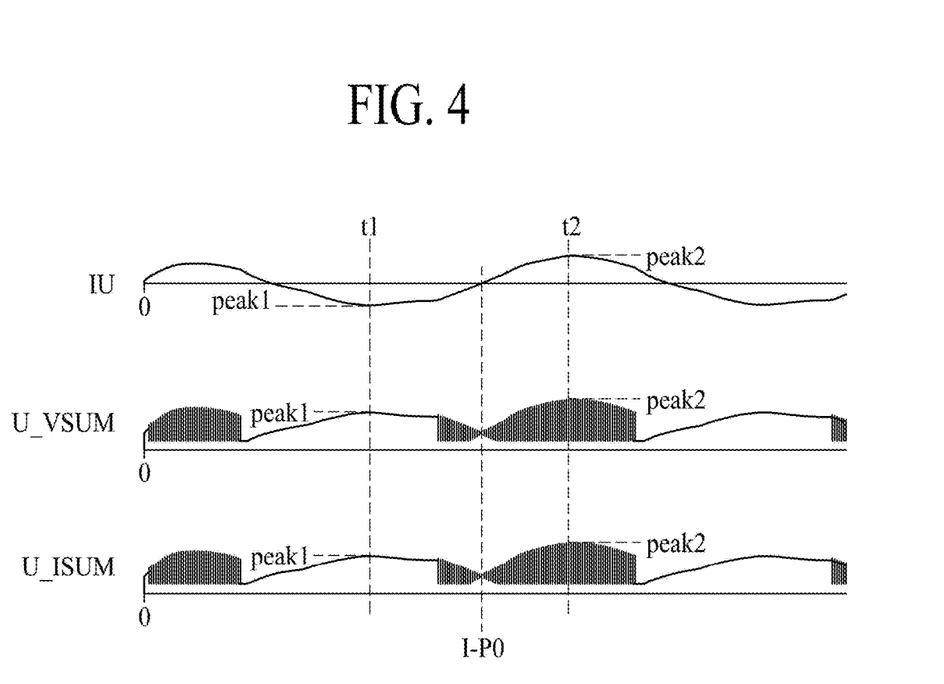
FIG. 4 is an exemplary waveform diagram showing signals related to the current detector shown in FIG. 3.

FIG. 3 is a block diagram showing a configuration of a current detector according to one embodiment, and FIG. 4 is an exemplary waveform diagram showing signals related to the current detector shown in FIG. 3.

Referring to FIG. 3, the current detector 210 may include a current sensor 220, an analog-to-digital converter (ADC) 230, and a zero current detector 240.

The current sensor 220 may output a sensing current IUSUM by sensing currents of each of the pull-up transistor Tup and the pull-down transistor Tun for driving a specific coil in the inverter 120 and summing the currents.

To this end, the current sensor 220 may include a first current sensor 222, a second current sensor 224, a current summer 226, and an operational amplifier 228. In one embodiment, it is shown that the current sensor 220 is connected to the first driver 122 of the inverter 120, but in another embodiment, the current sensor 220 may be connected to any one of the second driver 124 and the third driver 126 of the inverter 120.

The first current sensor 222 may sense and output a first current (high-side current) having a positive (+) polarity flowing to the first node U and a specific coil UC through the pull-up transistor Tup of the first driver 122.

The second current sensor 224 may sense and output a second current (low-side current) having a negative (−) polarity flowing to the pull-down transistor Tun through the specific coil UC and the first node U of the first driver 122.

The current summer 226 may sum the first current sensed by the first current sensor 222 and the second current sensed by the second current sensor 224 without polarity and amplify the currents through the operational amplifier 228 to output a summed current ISUM. In one embodiment, the operational amplifier 228 may output a voltage VSUM corresponding to the summed current ISUM.

Referring to FIG. 4, it can be seen that a summed current U_ISUM or voltage U_VSUM output from the current sensor 220 has peak values peak1 and peak2 synchronized with a phase current IU flowing through the specific coil.

The ADC 230 may digitize the output ISUM of the current sensor 220 and output sensing data.

The zero current detector 240 may detect time points t1 and t2 when each of the first and second peak values peak1 and peak2 is generated from the detected data received from the ADC 230. The zero current detector 240 may detect and output a median time point (t1+(t2−t1)/2) between the time points t1 and t2 when the first and second peak values peak1 and peak2 are generated as a zero-crossing point (I-P0) of the phase current IU.

Figure 5:
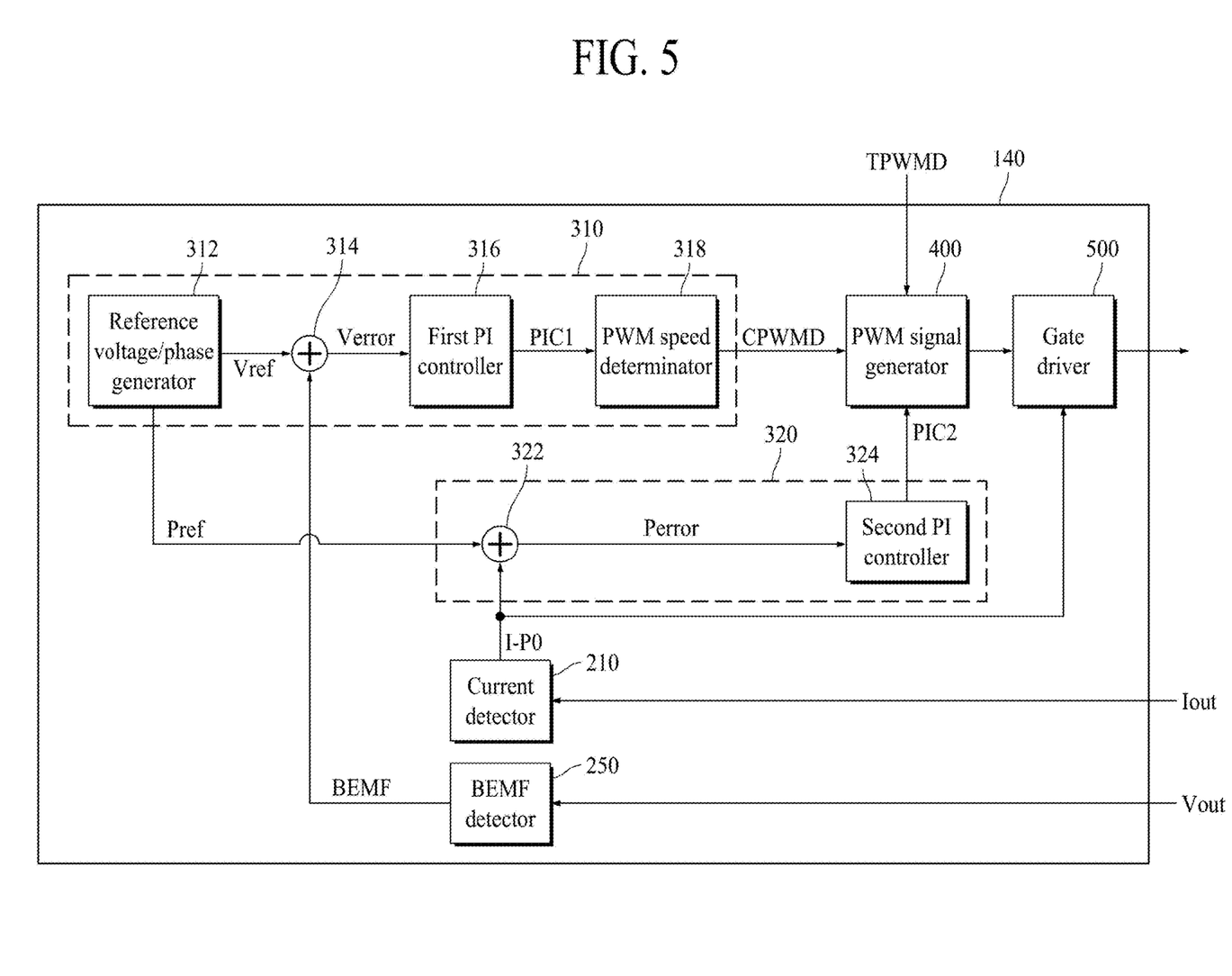
FIG. 5 is a block diagram mainly showing a detailed configuration of a speed controller and a phase controller of the motor driver according to one embodiment.

FIG. 5 is a block diagram mainly showing a detailed configuration of a speed controller and a phase controller of the motor driver according to one embodiment.

Referring to FIG. 5, the current detector 210 may sense the phase current Iout flowing through the specific coil through the inverter 120 for driving the BLDC motor 110 as shown in FIG. 4 and detect and output the zero-crossing point (I-P0) at which the phase current Iout becomes zero.

The gate driver 500 may set a floating period of a next cycle using the zero-crossing point (I-P0) received from the current detector 210 and float the specific coil UC through the inverter 120 in the set floating period.

The BEMF voltage detector 250 may sense the BEMF voltage of the specific coil UC by detecting and digitizing the phase voltage Vout of the floated specific coil UC through the inverter 120 at the zero-crossing point (I-P0) of the phase current received from the current detector 210.

The speed controller 310 may calculate a voltage error value Verror between a reference voltage Vref and the BEMF voltage received from the BEMF voltage detector 250 and control the PWM speed (frequency) to compensate for the calculated voltage error value Verror.

For example, the speed controller 310 may include a reference voltage/phase generator 312, a first subtracter 314, a first PI controller 316, and a PWM speed determinator 318.

The reference voltage/phase generator 312 may generate and output the reference voltage Vref and a reference phase Pref. The reference voltage/phase generator 312 may select and output any one of a plurality of reference voltages and select and output any one of a plurality of reference phases corresponding to the plurality of reference voltages.

The first subtracter 314 may acquire the voltage error value Verror by comparing (subtracting) the reference voltage Vref received from the reference voltage/phase generator 312 with (from) the BEMF voltage of the specific coil received from the BEMF voltage detector 250.

The first PI controller 316 may acquire a first PI control value PIC1 by applying proportional-integral (PI) control using a first proportional control coefficient and a first integral control coefficient to the voltage error value Verror. In one embodiment, the first PI controller 316 may acquire the first PI control value PIC1 using Equation 1 below.

$$PIC1(t) = K1p * \text{Verror}(t) + K1i * \int \text{Verror}(t) dt \qquad \text{[Equation 1]}$$

Here, t may refer to the time, and PIC1 may refer to the first PI control value. K1$p$ may refer to the first proportional control coefficient, K1$i$ may refer to the first integral control coefficient, and Verror may refer to the voltage error value.

The PWM speed determinator 318 may determine a speed compensation value for compensating for the voltage error value Verror based on the first PI control value PIC1. The PWM speed determinator 318 may determine a PWM duty compensation value CPWMD corresponding to the speed compensation value as the speed control value. The PWM speed determinator 318 may provide the speed control value including the PWM duty compensation value CPWMD to the PWM generator 400.

The phase controller 320 may calculate the phase error value Perror between the reference phase Pref and the phase of the phase current received from the current detector 210 at the zero-crossing point (I-P0) and control the PWM phase to compensate for the calculated phase error value Perror.

For example, the phase controller 320 may include a second subtracter 236 and a second PI controller 238.

The second subtracter 236 may acquire the phase error value Perror by comparing (subtracting) the reference phase Pref received from the reference voltage/phase generator 312 with (from) the phase of the phase current of the specific coil received from the current detector 210 at the zero-crossing point (I-P0).

The second PI controller 238 may acquire a second PI control value PIC2 by applying the PI control using a second proportional control coefficient and a second integral control coefficient to the phase error value Perror. In one embodiment, the second PI controller 238 may acquire the second PI control value PIC2 using Equation 2 below.

$$PIC2(t) = K2p * \text{Perror}(t) + K2i * \int \text{Perror}(t) dt \qquad \text{[Equation 2]}$$

Here, t may refer to the time, and PIC2 may refer to the second PI control value. K2$p$ may refer to the second proportional control coefficient, K2$i$ may refer to the second integral control coefficient, and Perror may refer to the phase error value. The second proportional control coefficient K2$p$ may be the same as the first proportional control coefficient K1$p$, and the second integral control coefficient K2$i$ may be the same as the first integral control coefficient K1$i$, but the present disclosure is not necessarily limited thereto. The second proportional control coefficient K2$p$ may be different from the first proportional control coefficient K1$p$, and the second integral control coefficient K2$i$ may be different from the first integral control coefficient K1$i$.

The second PI controller 238 may supply the second PI control value PIC2 determined as the phase control value to the PWM generator 400.

The PWM generator 400 may generate a PWM signal based on a target PWM duty cycle TPWMD received from the MCU 150 and a speed control value and a phase control value received from the pulse controller 300. The PWM generator 400 may increase the duty cycle of the PWM signal by applying the speed control value and the phase control value to the target PWM duty cycle TPWMD.

The gate driver 500 may generate the gate signals UP, UN, VP, VN, WP, and WN using the PWM signal according to the drive sequence of the three-phase coils UC, VC, and WC and output the gate signals to the inverter 120.

Figure 6:
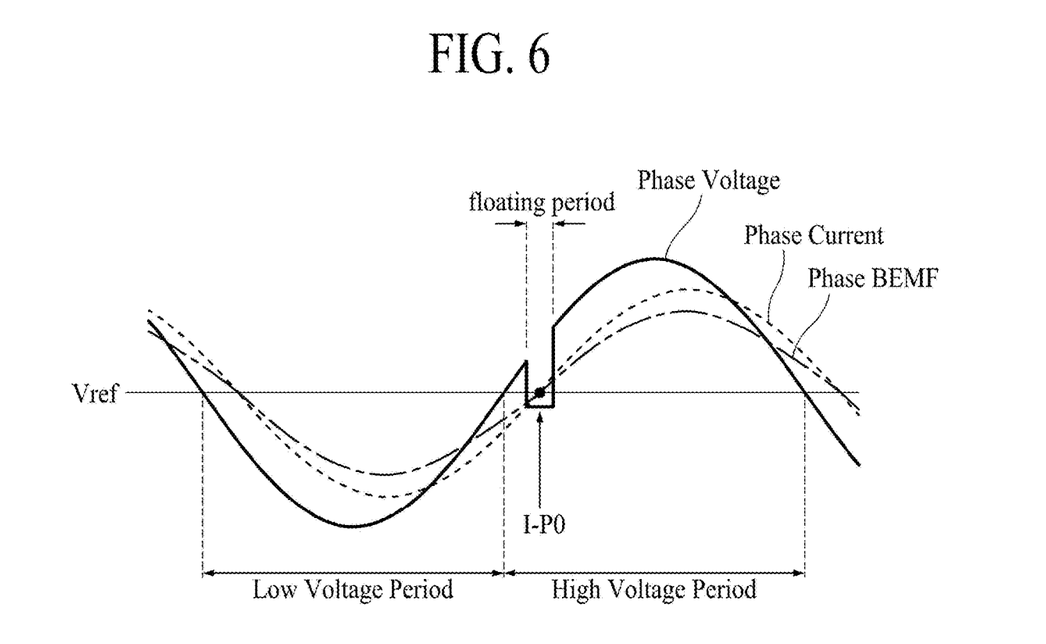
FIG. 6 is an exemplary waveform diagram showing a phase voltage, a phase current, and a back-electromotive force (BEMF) voltage of a specific coil during a floating period according to one embodiment.

FIG. 6 is an exemplary waveform diagram showing a case in which a phase of a phase current and a phase of a BEMF voltage are synchronized according to one embodiment.

Referring to FIG. 6, the motor driver 140 may determine the floating period of the phase voltage by detecting the zero-crossing point (I-P0) of the phase current and detect the BEMF voltage of the floated specific coil UC through the inverter 120 in the floating period.

The phase voltage period of the specific coil may include a high voltage period and a low voltage period. The floating period may be included in some periods of the high voltage period.

The motor driver 140 may detect the BEMF voltage of the floated specific coil UC through the inverter 120 at the zero-crossing point (I-P0) of the phase current.

In order to improve the drive efficiency of the BLDC motor 110, the motor driver 140 may control the PWM signal to synchronize the phase of the phase current with the phase of the BEMF voltage. To this end, the motor driver 140 may increase the duty cycle of the PWM signal so that the phase of the phase voltage is earlier than the phase of the phase current.

For example, the motor driver 140 may increase the PWM duty cycle by controlling the PWM speed so that the BEMF voltage detected at the zero-crossing point (I-P0) of the phase current matches the reference voltage Vref.

Figure 7:
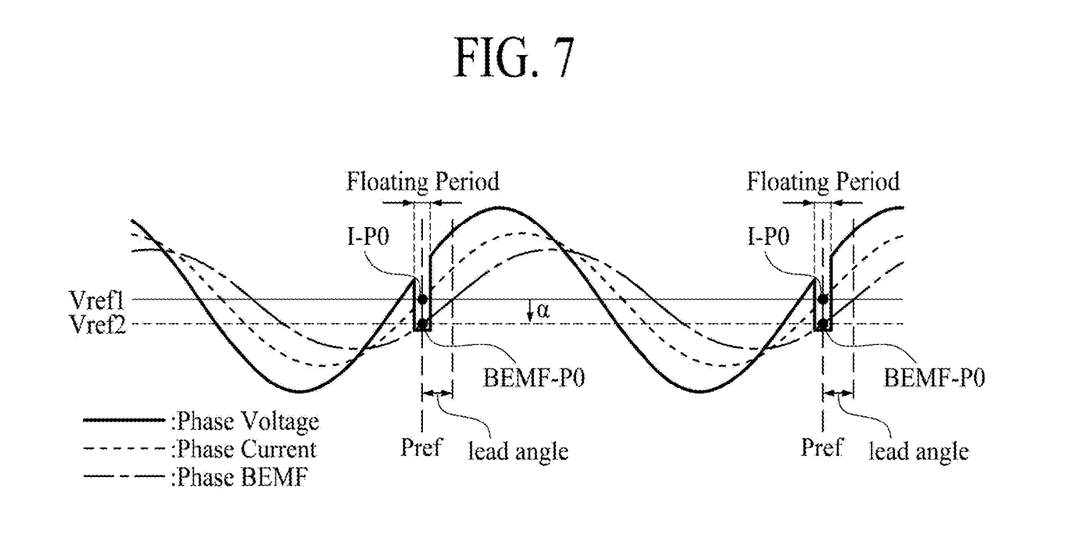
FIG. 7 is an exemplary waveform diagram showing a case in which a phase of the phase current has a lead angle to be earlier than a phase of the BEMF voltage according to one embodiment.

FIG. 7 is an exemplary waveform diagram showing a case in which a phase of the phase current has a lead angle to be earlier than a phase of the BEMF voltage according to one embodiment.

Referring to FIG. 7, the motor driver 140 according to one embodiment may quickly increase the speed of the BLDC motor 110 by controlling the PWM signal by applying the lead angle control so that the phase of the phase current of the specific coil is earlier than the phase of a phase BEMF voltage.

The motor driver 140 according to one embodiment may change a reference voltage Vref1 to a lower reference voltage Vref2 and control the PWM signal so that the phase BEMF voltage of the specific coil matches the second reference voltage Vref2.

The motor driver 140 may control the PWM signal so that the phase BEMF voltage detected at the zero-crossing point (I-P0) of the phase current matches the reduced reference voltage Vref2.

The phase of the BEMF voltage controlled using the second reference voltage Vref2 may be delayed from the phase of the BEMF voltage controlled using the first reference voltage Vref1, and thus the phase of the phase current may have a lead angle that is earlier than the phase of the phase BEMF.

The motor driver 140 according to one embodiment may reduce the second reference voltage Vref2 step by step until the drive speed of the BLDC motor 110 reaches the target speed in a lead angle control mode.

The motor driver 140 according to one embodiment may control the lead angle and increase the drive speed of the BLDC motor 110 by reducing the reference voltage Vref.

Figure 8:
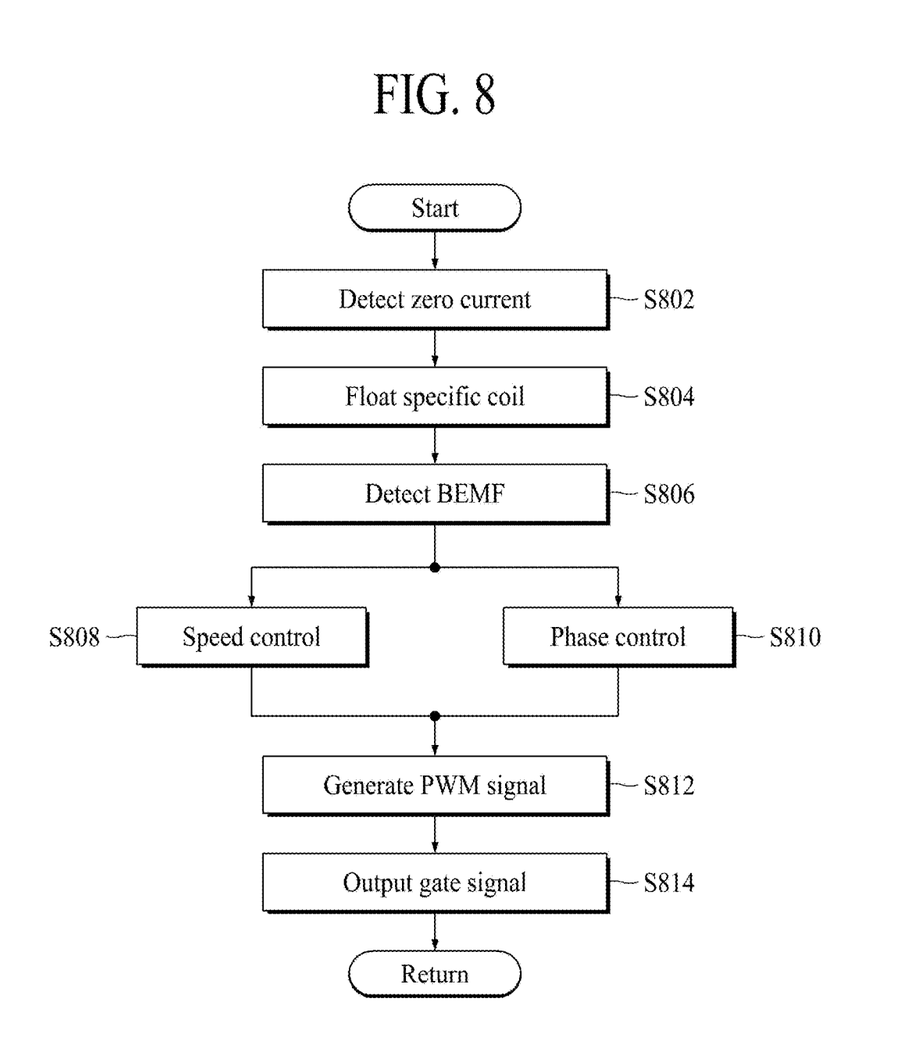
FIG. 8 is a flowchart showing a method of driving a motor of a BLDC motor drive system according to one embodiment.

FIG. 8 is a flowchart showing a method of driving a BLDC motor drive system according to one embodiment and will be described in conjunction with FIGS. 1 and 2.

When the BLDC motor 110 starts to drive by the BLDC motor drive system and operates at a normal speed, as shown in FIG. 4, the motor driver 140 may sense the phase current Iout flowing through the specific coil through the inverter 120 for driving the BLDC motor 110 and detect the zero-crossing point (I-P0) at which the phase current Iout becomes zero by detecting and using the peak value of the phase current (S802).

The motor driver 140 may set a floating period in a next cycle of the phase voltage using the detected zero-crossing point (I-P0) and float the specific coil through the inverter 120 in the set floating period (S804).

The motor driver 140 may detect the BEMF voltage of the specific coil UC by sensing and digitalizing the phase voltage Vout of the floated specific coil UC through the inverter 120 at the zero-crossing point (I-P0) of the phase current (S806).

The motor driver 140 may generate the speed control value for compensating the PWM speed (frequency) to minimize the voltage error between the reference voltage Vref and the detected BEMF voltage (S808).

The motor driver 140 may generate the phase control value for compensating the PWM phase to minimize the phase error between the reference phase Pref and the phase of the phase current at the detected zero-crossing point (I-P0) (S810).

The motor driver 140 may generate the PWM signal with adjusted PWM duty cycle based on the target PWM duty cycle TPWMD corresponding to the target speed, the speed control value, and the phase control value (S812).

The motor driver 140 may drive the BLDC motor 110 at the target speed by generating the gate signals UP, UN, VP, VN, WP, and WN using PWM signals according to the drive sequence of the three-phase coils UC, VC, and WC and outputting the gate signals to the inverter 120 (S814).

The motor driver 140 may repeatedly perform the operations (S802 to S814) while the BLDC motor 110 normally operates.

As described above, the motor driver, the motor drive system, and the method of driving the motor according to one embodiment of the present disclosure can precisely detect the zero-crossing point of the phase current using the sensed peak value of the phase current through the inverter.

The motor driver, the motor drive system, and the method of driving the motor according to one embodiment of the present disclosure can simply detect the BEMF voltage by sensing the phase voltage of the floated specific coil at the detected zero-crossing point of the phase current.

The motor driver, the motor drive system, and the method of driving the motor according to one embodiment of the present disclosure can control the PWM signal so that the phase of the phase current is synchronized with the phase of the BEMF voltage or earlier than the phase of the BEMF voltage by applying the lead angle control using the detected zero-crossing point of the phase current and the BEMF voltage, thereby increasing motor drive efficiency and quickly increasing the motor drive speed to the target speed.

What is claimed is:

1. A motor driver comprising:
    a current sensor connected to a switching circuit for driving a specific coil among three-phase coils and configured to sense a phase current flowing through the specific coil; and
    a zero detector configured to detect a time point when a first peak value is generated and a time point when a second peak value is generated from an output of the current sensor, and detect a zero-crossing point of the phase current using the time points when the first and second peak values are generated.

2. The motor driver of claim 1, further comprising an analog-to-digital converter configured to convert the output of the current sensor into sensing data and output the sensing data to the zero detector.

3. The motor driver of claim 1, wherein the current sensor includes:
    a first current sensor configured to sense a first current through a pull-up transistor of the switching circuit;

a second current sensor configured to sense a second current through a pull-down transistor of the switching circuit;

a current summer configured to sum the first current and the second current; and an operational amplifier configured to amplify an output of the current summer.

4. The motor driver of claim 1, wherein the zero detector is configured to detect a medial time point between the time point when the first peak value is generated and the time point when the second peak value is generated as the zero-crossing point of the phase current.

5. A motor driver comprising:
a current detector configured to detect a zero-crossing point of a phase current using a time point when a first peak value is generated and a time point when a second peak value is generated from a result of sensing the phase current flowing through a specific coil among three-phase coils through an inverter configured to drive the three-phase coils;

a back electromotive force (BEMF) voltage detector configured to detect a BEMF voltage of the specific coil in a floating period of the specific coil set based on the zero-crossing point;

a pulse controller including at least one of a speed controller configured to compensate for a voltage error between a reference voltage and the BEMF voltage and a phase controller configured to compensate for a phase error between a reference phase and a phase of the phase current at the zero-crossing point;

a pulse width modulation (PWM) generator configured to generate a PWM signal using an output of the pulse controller; and a gate driver configured to generate a plurality of gate signals for controlling the inverter using the PWM signal and output the plurality of gate signals to the inverter.

6. The motor driver of claim 5, wherein the current detector includes:
a current sensor configured to sense a first current through a pull-up transistor configured to drive the specific coil, sense a second current through a pull-down transistor, and sum the first and second currents to output the summed current;

an analog-to-digital converter configured to convert an output of the current sensor into sensing data and output the sensing data; and a zero detector configured to detect the time point when the first peak value is generated and the time point when the second peak value is generated from the sensing data, and detect a median time point between the time point when the first peak value is generated and the time point when the second peak value is generated as the zero-crossing point of the phase current.

7. The motor driver of claim 6, wherein the current sensor includes:
a first current sensor configured to sense the first current through the pull-up transistor;

a second current sensor configured to sense the second current through the pull-down transistor;

a current summer configured to sum the first current and the second current; and an operational amplifier configured to amplify an output of the current summer.

8. The motor driver of claim 5, wherein the gate driver is configured to set a floating period of the specific coil after receiving the zero-crossing point of the phase current from the current detector and float the specific coil through the inverter during the set floating period.

9. The motor driver of claim 5, wherein the speed controller includes:
a reference voltage and reference phase generator configured to generate the reference voltage and the reference phase;

a first subtracter configured to calculate the voltage error between the reference voltage and the BEMF voltage;

a first proportional-integral (PI) controller configured to acquire a first PI control value by applying PI control using a first proportional control coefficient and a first integral control coefficient to the voltage error; and a PWM speed determinator configured to determine a speed compensation value for compensating for the voltage error based on the first PI control value, and determine a PWM duty compensation value corresponding to the determined speed compensation value as a speed control value.

10. The motor driver of claim 5, wherein the phase controller includes:
a second subtracter configured to calculate the phase error between the reference phase and the phase of the phase current at the zero-crossing point; and a second PI controller configured to acquire a second PI control value by applying PI control using a second PI control coefficient to the phase error, and determine the second PI control value as a phase control value.

11. The motor driver of claim 9, wherein the reference voltage and reference phase generator is configured to:
select and output any one of a plurality of reference voltages; and select and output any one of a plurality of reference phases.

12. The motor driver of claim 9, wherein the reference voltage and reference phase generator is configured to output the reference voltage varying stepwise.

13. A motor drive system comprising:
a motor including three-phase coils;

an inverter configured to drive the three-phase coils in response to a pulse width modulation (PWM) gate signal;

a motor driver configured to generate the PWM gate signal; and a controller configured to supply a target PWM duty cycle corresponding to a target speed to the motor driver, wherein the motor driver is configured to:
detect a zero-crossing point of a phase current using a time point when a first peak value is generated and a time point when a second peak value is generated from a result of sensing the phase current flowing through a specific coil among the three-phase coils through the inverter;

detect a back electromotive force (BEMF) voltage of the specific coil in a floating period of the specific coil set based on the zero-crossing point;

perform speed control for determining a speed control value for compensating for a voltage error between a reference voltage and the BEMF voltage, and phase control for determining a phase control value for compensating for a phase error between a reference phase and a phase of the phase current at the zero-crossing point;

generate a PWM signal by applying the target PWM duty cycle, the speed control value, and the phase control value; and generate the PWM gate signal using the PWM signal to output the PWM gate signal to the inverter.

14. The motor drive system of claim 13, wherein the motor driver is configured to:
sense a first current through a pull-up transistor configured to drive the specific coil and a second current through a pull-down transistor;
sum the first and second currents and convert the summed current into sensing data; and
detect a median time point between the time point when the first peak value is generated and the time point when the second peak value is generated detected from the sensing data as the zero-crossing point of the phase current.

15. The motor drive system of claim 13, wherein the motor driver is configured to set a floating period of the specific coil about the zero-crossing point of the phase current, and float the specific coil through the inverter during the set floating period.

16. The motor drive system of claim 13, wherein the motor driver is configured to determine a speed compensation value by applying PI control using a first proportional control coefficient and a first integral control coefficient to the voltage error, and determine a PWM duty compensation value corresponding to the determined speed compensation value as the speed control value.

17. The motor drive system of claim 13, wherein the motor driver is configured to determine the phase control value by applying PI control using a second PI control coefficient to the phase error.

18. A method of driving a motor, comprising:
sensing a phase current flowing through a specific coil among three-phase coils through an inverter configured to drive the three-phase coils of a motor which normally operates, and detecting a zero-crossing point of the phase current using a peak value of the phase current;
setting a floating period in a next period using the detected zero-crossing point, and floating the specific coil in the set floating period;
detecting a back electromotive force (BEMF) voltage of the specific coil by sensing a voltage of the floated specific coil through the inverter at the zero-crossing point of the phase current;
performing speed control for determining a speed control value for compensating for a voltage error between a reference voltage and the BEMF voltage and phase control for determining a phase control value for compensating for a phase error between a reference phase and a phase of the phase current at the zero-crossing point;
generating a pulse width modulation (PWM) signal by applying a target PWM duty cycle, the speed control value, and the phase control value; and
generating a PWM gate signal for controlling the inverter using the PWM signal, and outputting the PWM gate signal to the inverter.

19. The method of claim 18, wherein the detecting of the zero-crossing point of the phase current includes:
sensing a first current through a pull-up transistor configured to drive the specific coil and a second current through a pull-down transistor;
summing the first and second currents, and converting the summed current into sensing data; and
detecting a median time point between a time point when a first peak value is generated and a time point when a second peak value is generated detected from the sensing data as the zero-crossing point of the phase current.

20. The method of claim 18, wherein the performing of the speed control and the phase control includes:
determining a speed compensation value by applying PI control using a first proportional control coefficient and a first integral control coefficient to the voltage error, and determining a PWM duty compensation value corresponding to the determined speed compensation value as the speed control value; and
determining a phase control value by applying the PI control using a second PI control coefficient to the phase error.

* * * * *